United States Patent
Tian et al.

(10) Patent No.: US 8,373,215 B2
(45) Date of Patent: Feb. 12, 2013

(54) ZERO TEMPERATURE COEFFICIENT CAPACITOR

(75) Inventors: Weidong Tian, Dallas, TX (US); Imran Khan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/267,674

(22) Filed: Oct. 6, 2011

(65) Prior Publication Data

US 2012/0098045 A1 Apr. 26, 2012

Related U.S. Application Data

(60) Provisional application No. 61/406,375, filed on Oct. 25, 2010.

(51) Int. Cl.
*H01L 29/92* (2006.01)

(52) U.S. Cl. ........ 257/296; 257/532; 257/E27.048; 438/239

(58) Field of Classification Search ......... 257/296, 257/532, E29.342, E21.409, E29.242; 438/239
See application file for complete search history.

(56) References Cited

U.S. PATENT DOCUMENTS

| | | | | | |
|---|---|---|---|---|---|
| 4,826,709 | A | * | 5/1989 | Ryan et al. | 438/782 |
| 4,938,847 | A | * | 7/1990 | Andrews et al. | 205/788 |
| 5,079,670 | A | * | 1/1992 | Tigelaar et al. | 361/313 |
| 6,503,841 | B1 | * | 1/2003 | Criscuolo et al. | 438/705 |
| 6,580,864 | B1 | * | 6/2003 | Temkin et al. | 385/132 |
| 2004/0209423 | A1 | * | 10/2004 | Tian et al. | 438/253 |

* cited by examiner

*Primary Examiner* — Steven Loke
*Assistant Examiner* — Sitaramarao S Yechuri
(74) *Attorney, Agent, or Firm* — Jacqueline J. Garner; Wade J. Brady, III; Frederick J. Telecky, Jr.

(57) ABSTRACT

A zero temperature coefficient (ZTC) capacitor including a silicon dioxide dielectric layer with a phosphorus density between $1.7 \times 10^{20}$ atoms/cm$^3$ and $2.3 \times 10^{20}$ atoms/cm$^3$. An integrated circuit containing a ZTC capacitor including a silicon dioxide dielectric layer with a phosphorus density between $1.7 \times 10^{20}$ atoms/cm$^3$ and $2.3 \times 10^{20}$ atoms/cm$^3$. A process of forming an integrated circuit containing a ZTC capacitor including a silicon dioxide dielectric layer with a phosphorus density between $1.7 \times 10^{20}$ atoms/cm$^3$ and $2.3 \times 10^{20}$ atoms/cm$^3$.

20 Claims, 6 Drawing Sheets

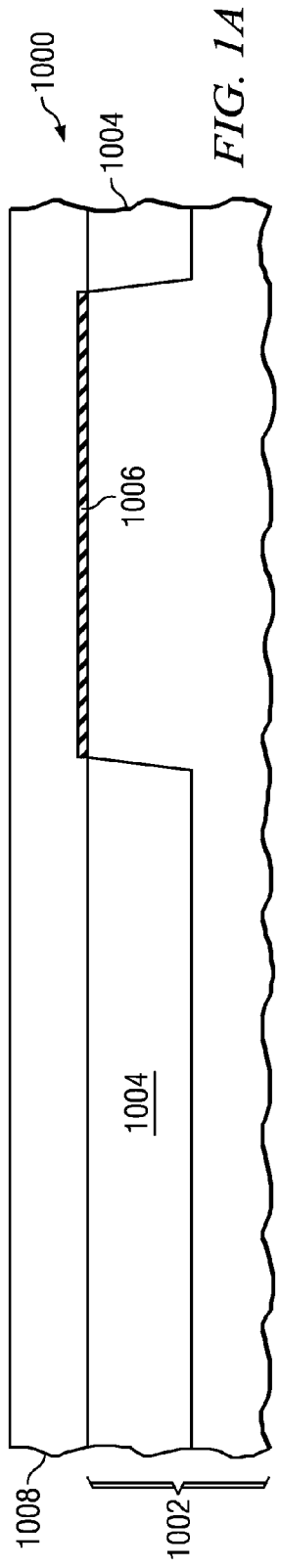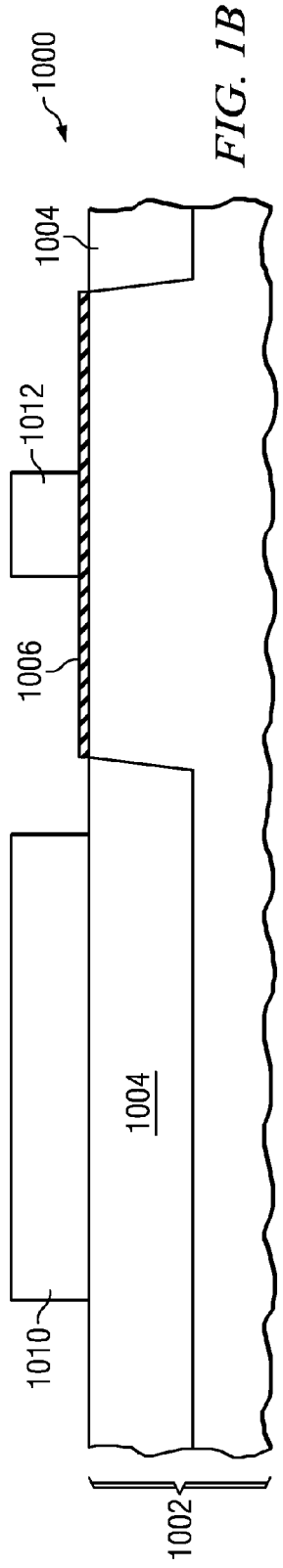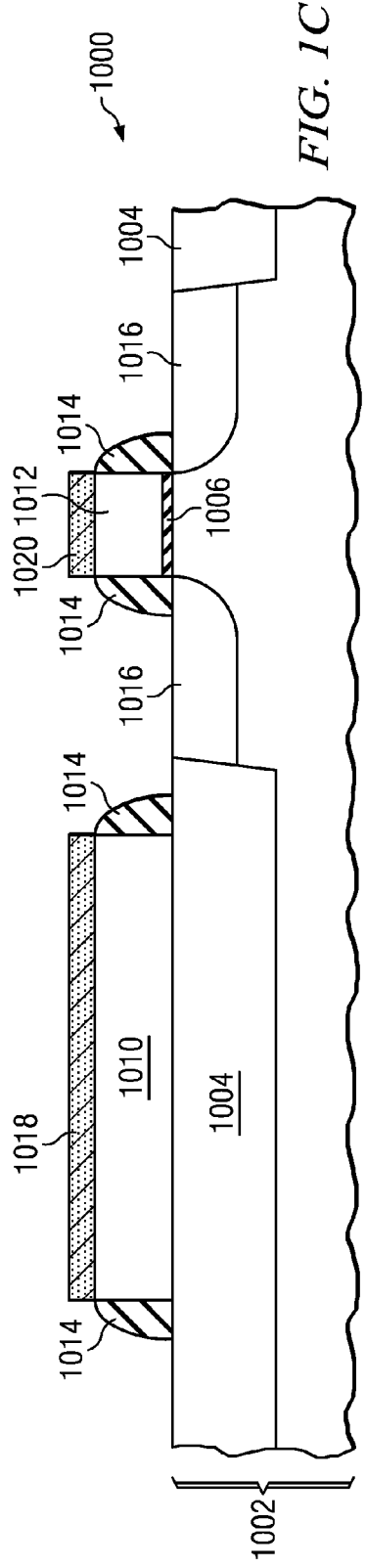

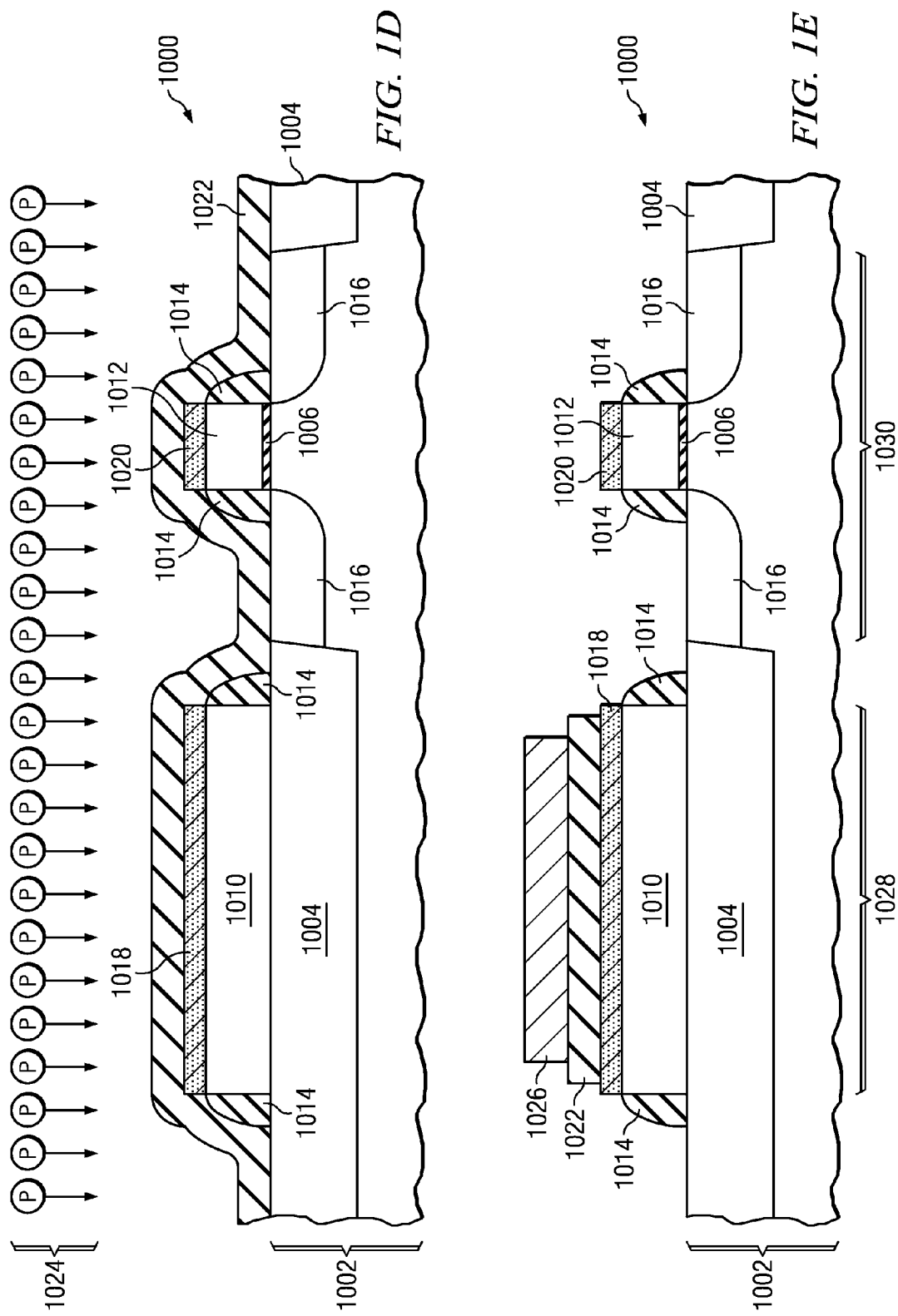

ZERO TEMPERATURE COEFFICIENT CAPACITOR

FIELD OF THE INVENTION

This invention relates to the field of electronic capacitors.

BACKGROUND OF THE INVENTION

Electronic capacitors may operate over a range of temperatures. It may be desirable to form a capacitor which exhibits substantially constant capacitance over an operational temperature range.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A zero temperature coefficient (ZTC) capacitor may be formed by forming a silicon dioxide capacitor dielectric layer, followed by placing phosphorus into the dielectric layer to obtain a phosphorus density between $1.7 \times 10^{20}$ atoms/cm$^3$ and $2.3 \times 10^{20}$ atoms/cm$^3$. The phosphorus may be ion implanted, provided from a diffusion source, or provided by other means. A temperature coefficient of the ZTC capacitor may be between −1 parts per million per degree Centigrade (ppm/° C.) and 1 ppm/° C. The ZTC capacitor may be formed as part of an integrated circuit.

DESCRIPTION OF THE VIEWS OF THE DRAWING

FIG. 1A through FIG. 1H are cross-sections of an integrated circuit containing ZTC capacitors formed according to embodiments, depicted in successive stages of fabrication.

DETAILED DESCRIPTION

Figure 1F:
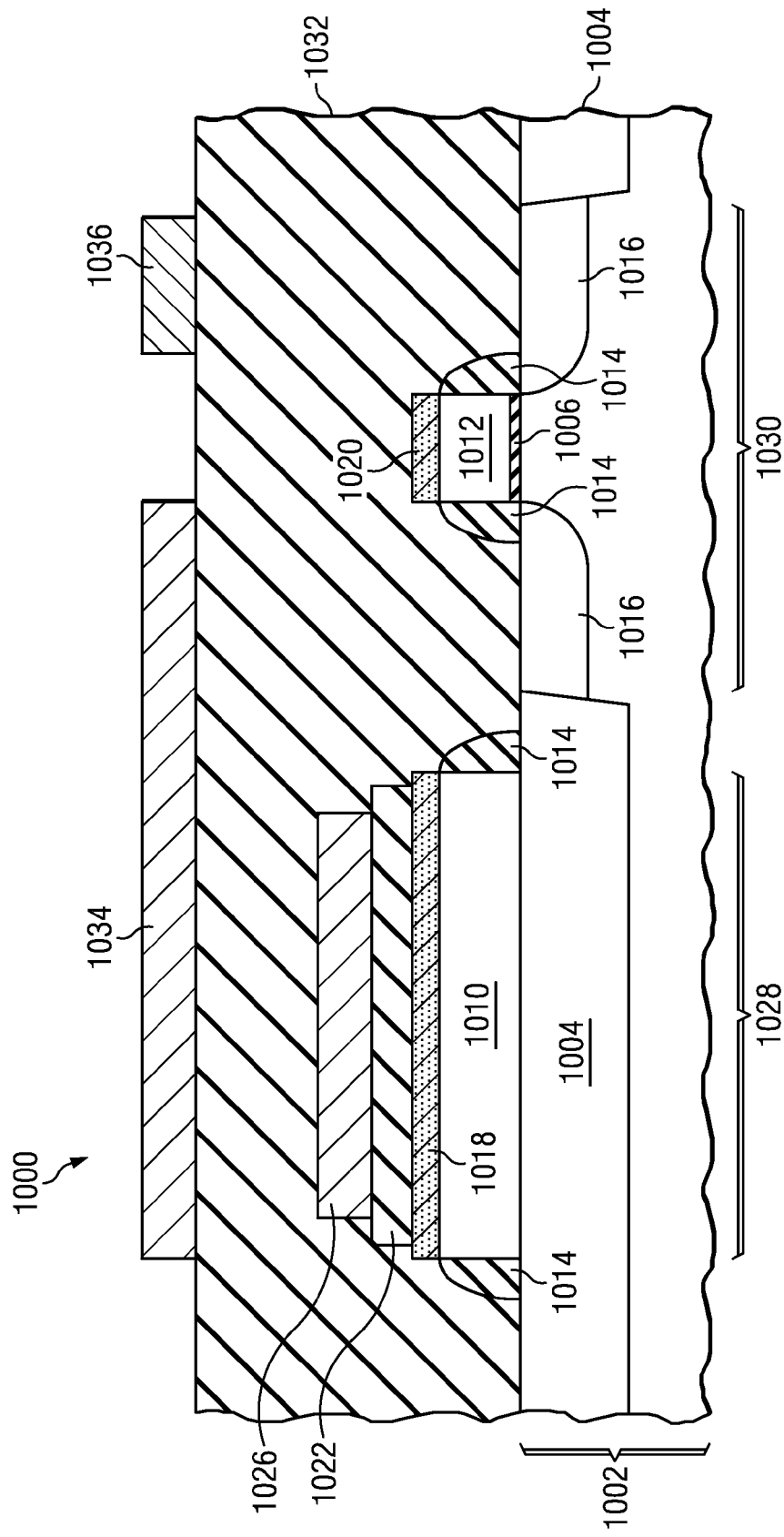

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A zero temperature coefficient (ZTC) capacitor may include a lower conducting plate, a capacitor dielectric layer and an upper conducting plate. A capacitance of the ZTC capacitor may vary over a temperature range. A temperature coefficient $K_T$ of the ZTC capacitor may be estimated by fitting measured capacitance values of the ZTC capacitor at more than one temperature in the temperature range to the expression of Equation 1:

$$C(T) = C(T_{REF}) \times [1 + (K_T \times (T - T_{REF}))] \quad \text{Equation 1}$$

where:

C (T) is a capacitance value at a temperature T, and $T_{REF}$ is a reference temperature, for example 27° C.

Phosphorus may be placed into the capacitor dielectric layer to obtain a phosphorus atom density between $1.7 \times 10^{20}$ atoms/cm$^3$ and $2.3 \times 10^{20}$ atoms/cm$^3$. Work performed in association with the instant invention indicate the temperature coefficient $K_T$ of the ZTC capacitor may be between −1 ppm/° C. and 1 ppm/° C.

The ZTC capacitor may be formed as part of an integrated circuit. In one embodiment, the bottom plate may include gate material used to form a gate of a metal oxide semiconductor (MOS) transistor in the integrated circuit. In another embodiment, the bottom plate may include metal used to form interconnects in the integrated circuit.

For the purposes of this description, terms describing elemental formulas of materials without subscripts do not imply a particular stoichiometry of the elements. For example, the term TiSiN describes a material containing titanium (Ti), silicon (Si) and nitrogen (N), not necessarily having a Ti:Si:N atomic ratio of 1:1:1. Terms describing elemental formulas of materials with subscripts imply a stoichiometry given by the subscripts. For example, the term SiO$_2$ describes a material containing silicon and oxygen (O) having a Si:O atomic ratio substantially equal to 1:2.

In some instances of integrated circuits containing a ZTC capacitor, substantially the entire integrated circuit is dedicated to the ZTC capacitor. In other instances of integrated circuits containing a ZTC capacitor, such as analog integrated circuits, the integrated circuits may contain another active component such as a metal oxide semiconductor (MOS) transistor.

FIG. 1A through FIG. 1H are cross-sections of an integrated circuit containing ZTC capacitors formed according to embodiments, depicted in successive stages of fabrication. Referring to FIG. 1A, the integrated circuit 1000 is formed in and on a substrate 1002, which may be a single crystal silicon wafer, but may be a silicon-on-insulator (SOI) wafer, a hybrid orientation technology (HOT) wafer with regions of different crystal orientations, a semiconductor wafer of another material such as gallium arsenide, or other material appropriate for fabrication of the IC 100. In one realization of the instant embodiment, the substrate 1002 may include an electrically insulating layer such as ceramic, crystalline aluminum oxide, glass, plastic or other non-conducting material.

One or more elements of field oxide 1004 may be formed at a top surface of the substrate 1002, for example of silicon dioxide between 250 and 600 nanometers thick. The field oxide elements 1004 may be formed by shallow trench isolation (STI) or local oxidation of silicon (LOCOS) processes. In STI processes, silicon dioxide may be deposited by high density plasma (HDP) or high aspect ratio process (HARP). In one realization of the instant embodiment, a gate dielectric layer 1006 for an MOS transistor may be formed at the top surface of the substrate 1002.

A first electrically conducting layer 1008 is formed on the substrate 1002, possibly contacting the field oxide elements 1004 if present and possibly contacting the gate dielectric layer 1006 if present. In a realization of the instant embodiment which includes an MOS transistor in the integrated circuit 1000, the first electrically conducting layer 1008 may include material such as polycrystalline silicon for forming a gate of the MOS transistor.

Referring to FIG. 1B, the first electrically conducting layer 1008 of FIG. 1A is patterned and etched to form a first capacitor lower plate 1010. In a realization of the instant embodiment which includes an MOS transistor in the integrated circuit 1000, an MOS gate 1012 may be formed from the first electrically conducting layer 1008 of FIG. 1A, concurrently with the first capacitor lower plate 1010.

Referring to FIG. 1C, sidewall spacers 1014 may be formed, for example of silicon nitride or layers of silicon nitride and silicon dioxide, on lateral surfaces of the first capacitor lower plate 1010, and on lateral surfaces of the MOS gate 1012 if formed. In a realization of the instant embodiment which includes an MOS transistor in the integrated circuit 1000, source and drain regions 1016 may be formed in the substrate 1002 adjacent to the MOS gate 1012. In realizations of the instant embodiment in which the first capacitor lower plate 1010 includes polycrystalline silicon, an optional metal silicide layer 1018 may be formed at a top surface of the first capacitor lower plate 1010. In a realization of the instant embodiment which includes an MOS transistor in the integrated circuit 1000, a metal silicide layer 1020 may be formed at a top surface of the MOS gate 1012. The metal silicide layers 1018 and 1020 if present may be formed by depositing a layer of metal, such as nickel, cobalt or titanium, on a top surface of the integrated circuit 1000, heating the integrated circuit 1000 to react a portion of the metal with exposed polycrystalline silicon, and selectively removing unreacted metal from the integrated circuit 1000 surface, for example by exposing the integrated circuit 1000 to wet etchants including a mixture of an acid and hydrogen peroxide.

Referring to FIG. 1D, a first capacitor dielectric layer 1022 is formed on the integrated circuit 1000. The first capacitor dielectric layer 1022 is composed of silicon dioxide, possibly including other elements such as carbon or fluorine. A total density of atoms in the first capacitor dielectric layer 1022 other than silicon and oxygen is less than $1 \times 10^{18}$ atoms/cm$^3$. The first capacitor dielectric layer 1022 may be between 10 and 200 nanometers thick. In one realization of the instant embodiment, the first capacitor dielectric layer 1022 may be between 45 and 55 nanometers thick. The first capacitor dielectric layer 1022 may be formed by chemical vapor deposition (CVD), plasma enhanced chemical vapor deposition (PECVD), low pressure chemical vapor deposition (LPCVD), atmospheric pressure chemical vapor deposition (APCVD), high density plasma (HDP), an ozone based thermal chemical vapor deposition (CVD) process, also known as the high aspect ratio process (HARP), or other suitable silicon dioxide layer formation process deposition. The first capacitor dielectric layer 1022 may be formed by decomposition of tetraethyl orthosilicate, also known as tetraethoxysilane or TEOS, or deposition of methylsilsesquioxane (MSQ).

A first phosphorus placement process 1024 is performed which places phosphorus atoms in the first capacitor dielectric layer 1022. The first phosphorus placement process 1024 is adjusted to provide an average density of phosphorus atoms in the first capacitor dielectric layer 1022 between $1.7 \times 10^{20}$ atoms/cm$^3$ and $2.3 \times 10^{20}$ atoms/cm$^3$. For example, in a realization of the instant embodiment in which the first capacitor dielectric layer 1022 is 50 nanometers thick, the first phosphorus placement process 1024 is performed to provide a dose between $8.5 \times 10^{14}$ atoms/cm$^2$ and $1.15 \times 10^{14}$ atoms/cm$^2$. In one realization of the instant embodiment, the first phosphorus placement process 1024 may be an ion implantation process; an implantation energy of the first phosphorus placement process 1024 may be adjusted to place a peak of a distribution of the implanted phosphorus atoms approximately in a center of the first capacitor dielectric layer 1022. For example, in a realization of the instant embodiment in which the first capacitor dielectric layer 1022 is 50 nanometers thick, the implantation energy of the first phosphorus placement process 1024 may be set between 10 and 20 kiloelectron-volts (keV). In an alternate realization of the instant embodiment, the first phosphorus placement process 1024 may include exposing the integrated circuit 1000 to a phosphorus containing gas at a temperature above 300 C. In another realization, the first phosphorus placement process 1024 may include exposing the integrated circuit 1000 to a phosphorus containing plasma. In a further realization, phosphorus may be placed in the first capacitor dielectric layer 1022 by other means.

Referring to FIG. 1E, the first capacitor dielectric layer 1022 may optionally be patterned and etched to form a boundary proximate to a boundary of the first capacitor lower plate 1010, as depicted in FIG. 1E. A first capacitor upper plate 1026 is formed on the first capacitor dielectric layer 1022. The first capacitor upper plate 1026 is formed of electrically conducting material, such as metal or doped semiconductor material. In one realization of the instant embodiment, the first capacitor upper plate 1026 may include Ti, TiN, TiSiN, Ta, TaN, TaSiN, W, WN, WSiN, or any combination thereof, between 50 and 400 nanometers thick. In another realization, the first capacitor upper plate 1026 may include aluminum, copper, gold or other metal used for interconnects in the integrated circuit 1000, between 50 and 500 nanometers thick.

The first capacitor lower plate 1010, the first capacitor dielectric layer 1022 with a phosphorus density between $1.7 \times 10^{20}$ atoms/cm$^3$ and $2.3 \times 10^{20}$ atoms/cm$^3$ and the first capacitor upper plate 1026 form a first ZTC capacitor 1028. The gate dielectric layer 1006, MOS gate 1012 and source and drain regions 1016, if present, are part of an MOS transistor 1030 formed in and on the substrate 1002.

Figure 1G:
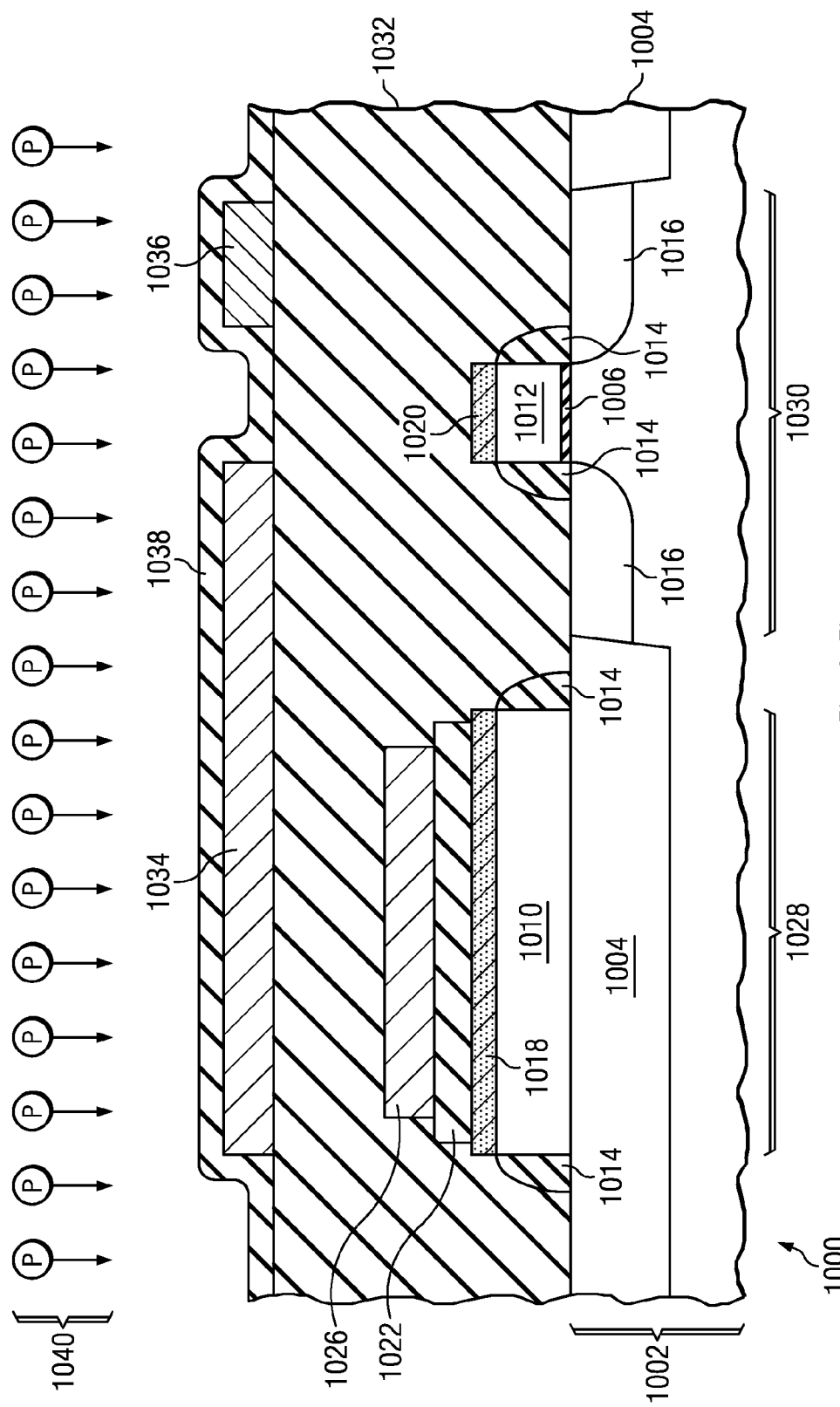
Figure 1H:
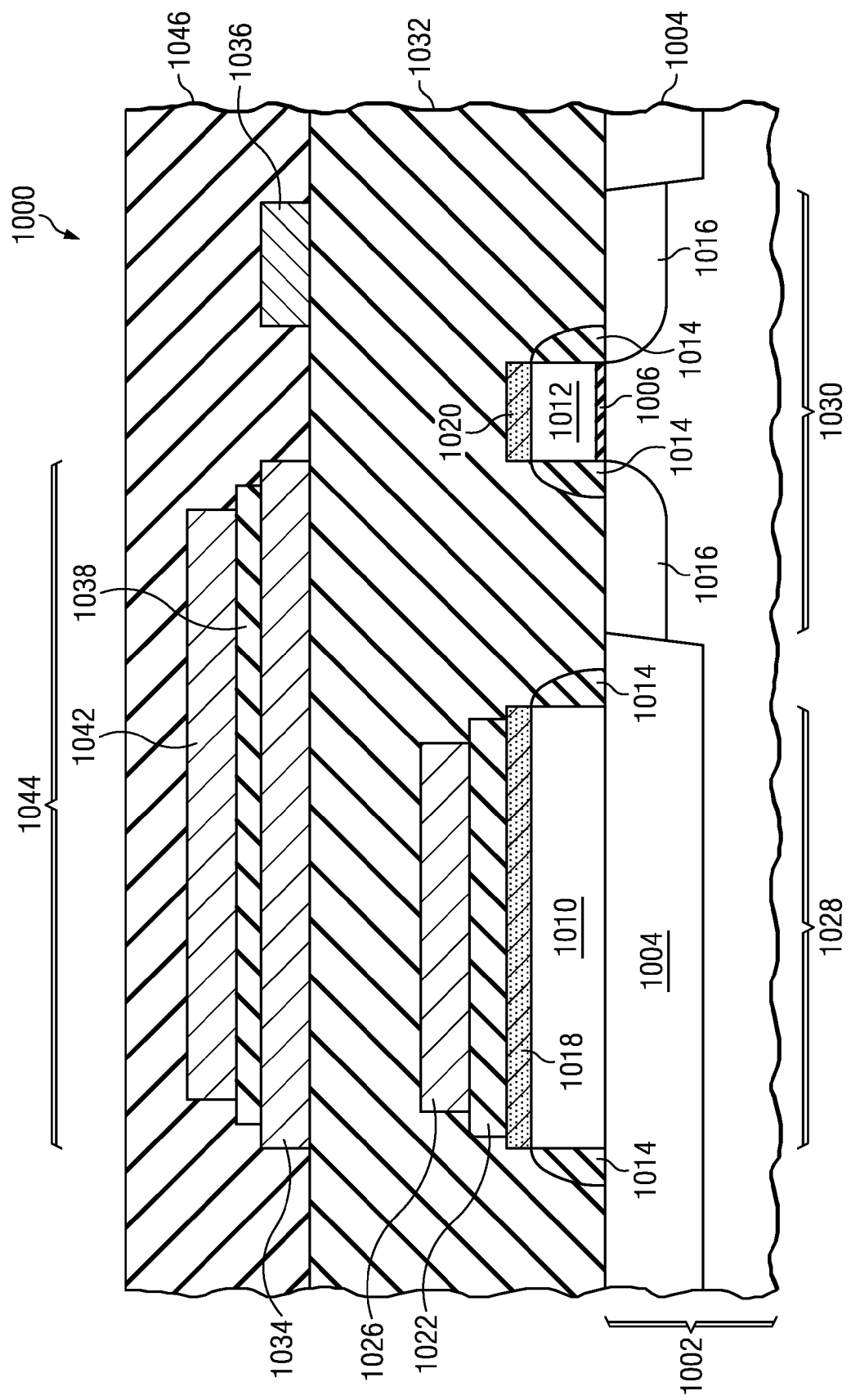

A second ZTC capacitor may be formed in the integrated circuit 1000 in an interconnect region above the substrate 1002, as described in reference to FIG. 1F through FIG. 1H. Referring to FIG. 1F, a first interconnect dielectric layer 1032 is formed on the integrated circuit 1000. The first interconnect dielectric layer 1032 may include one or more layers of silicon dioxide, silicon nitride, organo-silicate glass (OSG), carbon-doped silicon oxides (SiCO or CDO), fluorosilicate glass (FSG), or other dielectric material. The first interconnect dielectric layer 1032 may include one or more layers of metal interconnect elements such as metal lines of aluminum, copper and/or gold, and vias of aluminum, copper, gold, and/or tungsten. Metal interconnect elements in the first interconnect dielectric layer 1032 are not shown in FIG. 1F.

A second capacitor lower plate 1034 is formed on the first interconnect dielectric layer 1032. The second capacitor lower plate 1034 is formed of electrically conductive material, such as metal or doped semiconductor material. An optional metal interconnect line 1036 may be formed on the first interconnect dielectric layer 1032. In one realization of the instant embodiment, the second capacitor lower plate 1034 may be formed concurrently with the metal interconnect line 1036. The second capacitor lower plate 1034 and metal interconnect line 1036 if formed may include aluminum, copper and/or gold.

Referring to FIG. 1G, a second capacitor dielectric layer 1038 is formed on the integrated circuit 1000 as described in reference to FIG. 1D. Material properties and possible formation processes of the second capacitor dielectric layer 1038 are as described in reference to FIG. 1D. In one realization of the instant embodiment, a thickness of the second capacitor dielectric layer 1038 may be different from the thickness of the first capacitor dielectric layer 1022. In an alternate realization, the thickness of the second capacitor dielectric layer 1038 may substantially equal to the thickness of the first capacitor dielectric layer 1022. In one realization of the instant embodiment, the formation process of the second capacitor dielectric layer 1038 may use process parameters different from those of the first capacitor dielectric layer 1022.

A second phosphorus placement process 1040 is performed which places phosphorus atoms into the second capacitor dielectric layer 1038. The second phosphorus placement process 1040 is adjusted to provide a phosphorus density as described in reference to FIG. 1D. In one realization of the instant embodiment, the second phosphorus placement process 1040 may be an ion implantation process, as described in reference to FIG. 1D. In an alternate realization, the second phosphorus placement process 1040 may be a diffusion process from a phosphorus containing gas as described in reference to FIG. 1D. In another realization, the second phosphorus placement process 1040 may be include exposure to a phosphorus containing plasma, as described in reference to FIG. 1D. In a further realization, the phosphorus may be placed in the second capacitor dielectric layer 1038 by other means.

Referring to FIG. 1H, the second capacitor dielectric layer 1038 may optionally be patterned and etched to form a boundary proximate to a boundary of the second capacitor lower plate 1034, as depicted in FIG. 1H. A second capacitor upper plate 1042 is formed on the second capacitor dielectric layer 1038. The second capacitor upper plate 1042 is formed of electrically conductive material such as metal or doped semiconductor material. In one realization of the instant embodiment, the second capacitor upper plate 1042 may include Ti, TiN, TiSiN, Ta, TaN, TaSiN, W, WN, WSiN, or any combination thereof, between 50 and 400 nanometers thick. In another realization, the second capacitor upper plate 1042 may include aluminum, copper, gold or other metal used for interconnects in the integrated circuit 1000, between 100 and 2000 nanometers thick.

The second capacitor lower plate 1034, the second capacitor dielectric layer 1038 with a phosphorus density between $1.7\times10^{20}$ atoms/cm$^3$ and $2.3\times10^{20}$ atoms/cm$^3$ and the second capacitor upper plate 1042 form a second ZTC capacitor 1044.

An optional second interconnect dielectric layer 1046 may be formed over the second ZTC capacitor 1044. The second interconnect dielectric layer 1046 if formed may include materials described in reference to the first interconnect dielectric layer 1032. The second interconnect dielectric layer 1046 may include one or more layers of metal interconnect elements such as metal lines of aluminum, copper and/or gold, and vias of aluminum, copper, gold, and/or tungsten. Metal interconnect elements are not shown in FIG. 1H.

In one realization of the instant embodiment, the integrated circuit 1000 may include only the first ZTC capacitor 1028 and not the second ZTC capacitor 1044. In another realization of the instant embodiment, the integrated circuit 1000 may include both the first ZTC capacitor 1028 and the second ZTC capacitor 1044. In an alternate embodiment, an integrated circuit may contain only an instance of a ZTC capacitor formed above an interconnect dielectric layer, as described in reference to the second ZTC capacitor 1044 of FIG. 1H.

Figure 2:
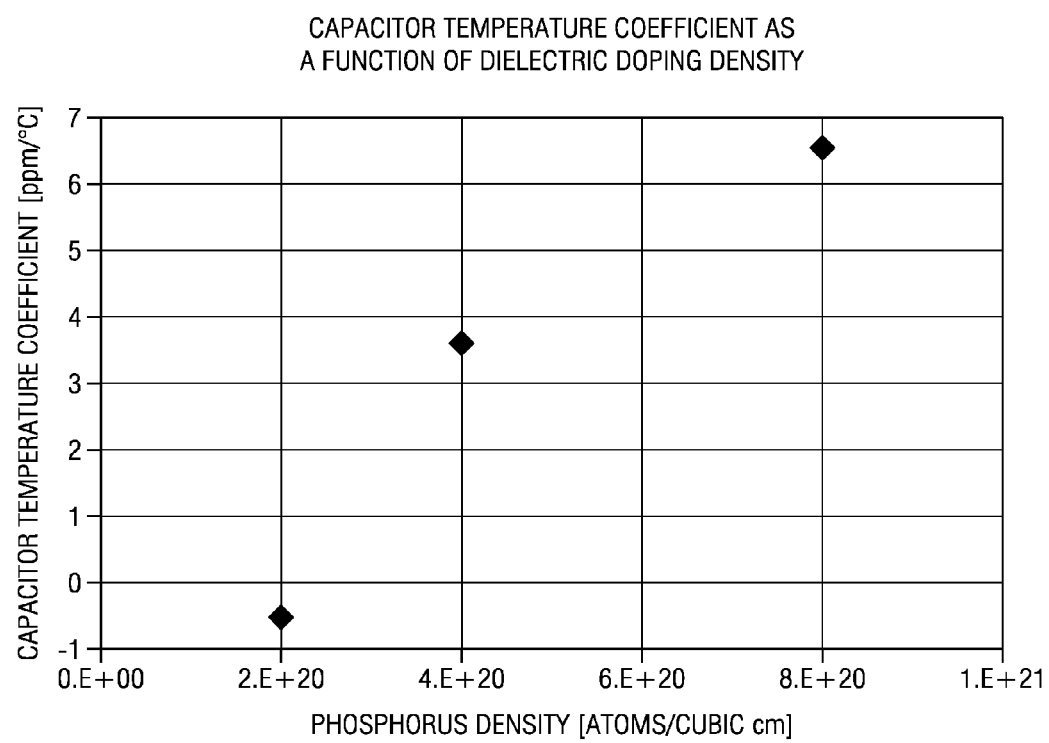
FIG. 2 is a chart of measured temperature coefficients of capacitors as a function of phosphorus density in dielectric layers of the capacitors.

FIG. 2 is a chart of measured temperature coefficients of capacitors as a function of phosphorus density in dielectric layers of the capacitors. Data in FIG. 2 are from work performed in association with the instant invention, using a capacitor dielectric layer approximately 50 nanometers thick, and ion implanted with phosphorus at an ion implant energy of 16 keV. It will be recognized by one familiar with fabricating capacitors, having reference to the data shown in FIG. 2, that providing a phosphorus density between $1.7\times10^{20}$ atoms/cm$^3$ and $2.3\times10^{20}$ atoms/cm$^3$ may provide a temperature coefficient between $-1$ ppm/° C. and 1 ppm/° C.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A zero temperature coefficient (ZTC) capacitor, comprising:
   a capacitor lower plate, said capacitor lower plate including electrically conductive material;
   a capacitor dielectric layer of silicon dioxide formed over said capacitor lower plate, said capacitor dielectric layer having a phosphorus density between $1.7\times10^{20}$ atoms/cm$^3$ and $2.3\times10^{20}$ atoms/cm$^3$, such that a total density of atoms in said capacitor dielectric layer other than phosphorus, silicon and oxygen is less than $1\times10^{18}$ atoms/cm$^3$; and
   a capacitor upper plate formed over said capacitor dielectric layer, said capacitor upper plate including electrically conductive material.

2. The ZTC capacitor of claim 1, in which said capacitor dielectric layer is between 45 and 55 nanometers thick.

3. The ZTC capacitor of claim 1, in which said capacitor lower plate includes polycrystalline silicon.

4. The ZTC capacitor of claim 3, in which said capacitor upper plate includes material selected from the group consisting of Ti, TiN, TiSiN, Ta, TaN, TaSiN, W, WN, WSiN, and any combination thereof.

5. The ZTC capacitor of claim 1, in which said capacitor lower plate includes metal selected from the group consisting of aluminum, copper, and gold.

6. An integrated circuit, comprising:
   a substrate; and
   a ZTC capacitor formed over said substrate, said ZTC capacitor including:
      a capacitor lower plate formed over said substrate, said capacitor lower plate including electrically conductive material;
      a capacitor dielectric layer of silicon dioxide formed over said capacitor lower plate, said capacitor dielectric layer having a phosphorus density between $1.7\times10^{20}$ atoms/cm$^3$ and $2.3\times10^{20}$ atoms/cm$^3$, such that a total density of atoms in said capacitor dielectric layer other than phosphorus, silicon and oxygen is less than $1\times10^{18}$ atoms/cm$^3$; and
      a capacitor upper plate formed over said capacitor dielectric layer, said capacitor upper plate including electrically conductive material.

7. The integrated circuit of claim 6, in which said capacitor dielectric layer is between 45 and 55 nanometers thick.

8. The integrated circuit of claim 6, in which:
said integrated circuit further includes an element of field oxide formed at a top surface of said substrate;
said capacitor lower plate is formed on said field oxide element; and
said capacitor lower plate includes polycrystalline silicon.

9. The integrated circuit of claim 8, in which said capacitor upper plate includes material selected from the group consisting of Ti, TiN, TiSiN, Ta, TaN, TaSiN, W, WN, WSiN, and any combination thereof.

10. The integrated circuit of claim 6, in which:
said integrated circuit further includes an interconnect dielectric layer formed over said substrate,
a metal interconnect line formed on said interconnect dielectric layer;
said capacitor lower plate is formed on said interconnect dielectric layer concurrently with said metal interconnect line; and
said capacitor lower plate includes metal selected from the group consisting of aluminum, copper, and gold.

11. The integrated circuit of claim 6, in which said integrated circuit further includes a metal oxide semiconductor (MOS) transistor formed in and on said substrate.

12. A process of forming an integrated circuit, comprising;
providing a substrate; and
forming a ZTC capacitor over said substrate, by a process including steps:
forming a capacitor lower plate over said substrate, said capacitor lower plate including electrically conductive material;
forming a capacitor dielectric layer of silicon dioxide over said capacitor lower plate, such that a total density of atoms in said capacitor dielectric layer other than silicon and oxygen is less than $1 \times 10^{18}$ atoms/cm$^3$;
placing phosphorus into said capacitor dielectric layer so as to provide a phosphorus density between $1.7 \times 10^{20}$ atoms/cm$^3$ and $2.3 \times 10^{20}$ atoms/cm$^3$ in said capacitor dielectric layer; and
forming a capacitor upper plate over said capacitor dielectric layer, said capacitor upper plate including electrically conductive material.

13. The process of claim 12, in which said capacitor dielectric layer is between 45 and 55 nanometers thick.

14. The process of claim 13, in said step of placing phosphorus is performed by an ion implantation process so that a total dose of phosphorus in said capacitor dielectric layer is between $8.5 \times 10^{14}$ atoms/cm$^2$ and $1.15 \times 10^{14}$ atoms/cm$^2$, and so that a peak of a distribution of said implanted phosphorus is approximately in a center of said capacitor dielectric layer.

15. The process of claim 12, in which said step of placing phosphorus is performed by exposing said integrated circuit to a phosphorus containing gas at a temperature above 300 C.

16. The process of claim 12, in which said step of placing phosphorus is performed by exposing said integrated circuit to a phosphorus containing plasma.

17. The process of claim 12, in which:
said process of forming said integrated circuit further includes a step of forming an element of field oxide at a top surface of said substrate; and
said step of forming said capacitor lower plate is performed so that said capacitor lower plate is formed of polycrystalline silicon on said field oxide element.

18. The process of claim 17, in which said capacitor upper plate includes material selected from the group consisting of Ti, TiN, TiSiN, Ta, TaN, TaSiN, W, WN, WSiN, and any combination thereof.

19. The process of claim 12, in which:
said process of forming said integrated circuit further includes:
forming an interconnect dielectric layer over said substrate; and
forming a metal interconnect line on said interconnect dielectric layer;
said capacitor lower plate is formed on said interconnect dielectric layer concurrently with said metal interconnect line; and
said capacitor lower plate includes metal selected from the group consisting of aluminum, copper, and gold.

20. The process of claim 12, further including:
forming a gate dielectric layer on said substrate;
forming an MOS gate on said gate dielectric layer;
forming source and drain regions in said substrate adjacent to said MOS gate.

* * * * *